United States Patent [19]
Cox, Jr. et al.

[11] Patent Number: 5,101,106
[45] Date of Patent: Mar. 31, 1992

[54] RESONANT TECHNIQUE AND APPARATUS FOR THERMAL CAPACITOR SCREENING

[75] Inventors: Eldon E. Cox, Jr., Lowell; Michael P. Rolla, Maynard, both of Mass.

[73] Assignee: Digital Equipment Corporation, Maynard, Mass.

[21] Appl. No.: 679,118

[22] Filed: Apr. 2, 1991

[51] Int. Cl.$^5$ .............................................. G01R 31/00
[52] U.S. Cl. .................................. 250/316.1; 324/501; 324/548; 374/124
[58] Field of Search ...................... 250/316.1; 374/124; 324/501, 548, 537, 633, 652, 682

[56] References Cited

U.S. PATENT DOCUMENTS 5,006,788  4/1991  Goulette et al. ...................... 324/95

Primary Examiner—Janice A. Howell
Assistant Examiner—James E. Beyer
Attorney, Agent, or Firm—Finnegan, Henderson, Farabow, Garrett and Dunner

[57] ABSTRACT

A method and system for driving a plurality of transient decoupling capacitors connected in a circuit in order to heat them and to screen them via a thermal image of them. Radio-frequency excitation is provided for the purpose by connecting a pulse driver through an inductive circuit and a series capacitance to supply a driving current to the decoupling capacitors. The inductance is selected to yield resonance at a selected frequency; and the series capacitance provides a voltage divider to help set the frequency and to adjust the level of the drive of the decoupling capacitors.

13 Claims, 3 Drawing Sheets

RESONANT TECHNIQUE AND APPARATUS FOR THERMAL CAPACITOR SCREENING

FIELD OF THE INVENTION

The present invention relates to a resonant technique and apparatus for screening of capacitors by thermal imaging, especially capacitors having intrinsically low dissipation and capacitors connected in-place in large numbers in electronic logic circuits as transient decoupling capacitors.

BACKGROUND OF INVENTION

The early discovery of hidden defects in parts and products is of increasing concern to manufacturers as they strive to obtain superior product quality. Particularly, there is a need for the early discovery of defects which could remain latent or undiscovered for an indeterminate time. There is also a need in the field of electronic circuits to determine properties of components and parts, such as capacitors, which may be predictive of a lack of long term reliability, even though not ordinarily indicative of defects.

Thermography, or thermal analysis, has attracted considerable attention as one way of discovering such defects or properties of parts. All objects "glow" from thermal radiation with an intensity and "color" which is dependent upon temperature. At room temperature this color is within a range known as infrared and cannot be seen with the unaided eye. At extreme temperatures an object will glow visibly as in the case of iron heated in a fire. This thermally radiative property of objects can be used to measure the temperature of an object's surface without need for any kind of contact. Any of several types of equipment can convert this temperature information into a black and white or color image that represents the temperatures within the scene. Such equipment can be called a "thermal imager" and can be used to study non-visible properties of electronic assemblies in the hope of locating defective devices or devices which may eventually prove to be less reliable than others.

Capacitors, in particular, are exceedingly difficult to test, or "screen", in the production quantities that are commercially necessary because they tend to have small variations in lead resistances and other properties which are hard to test because the capacitor conducts electricity only transiently as it charges or discharges. One consequence of that fact is that capacitors are not easily heated for thermographic testing.

Moreover, it is a property of modern electronic logic circuits that large numbers of small capacitors, e.g., in the range from 0.0 1 $\mu f$ to 1.0 $\mu f$, are used in circuits primarily for the purpose of protecting the active devices, such as integrated circuits and the transistors and other components therein, from transients. These capacitors are known as transient decoupling capacitors, as well as by other names. The result in a typical integrated logic circuit is that there are a large number of such transient decoupling capacitors. All such capacitors reach fairly directly to the power supply in their connections; but it is a property of any such decoupling capacitor that, if it is to be useful, it must be immediately adjacent to the transistor which it is intended to protect so that the varying lengths of leads will not support transients that will damage the transistor. Nevertheless, despite the varying lead lengths from the power supply to such transient decoupling capacitors, these capacitors are essentially connected in parallel with one another. This makes the testing of the completed circuit board even more difficult because conventional test methods are unable to discern individually defective capacitors when connected in parallel (with the exception of direct shorts).

In the section entitled "Thermography", in *Evaluation Engineering*, December 1988, particularly in the article entitled "Understanding the Expanded Role of Thermal Imagers in Production Testing" by Hugh Danaher, starting at page 74, it is explained that thermal imaging can be very useful in screening integrated circuits, each of which has multiple such capacitors. At page 77, it is stated:

An alternate test method is to apply a high-frequency (10 kHz), low-voltage (0.5V) ac supply which will cause all capacitors to heat. Using this approach, all capacitor conditions can be determined. Open capacitors will not heat, shorted capacitors will heat excessively and out-of-spec capacitors will exhibit different thermal characteristics than the accepted standard.

Our experimental efforts to duplicate the above-described testing technique indicates the technique as described is primarily useful for testing individual capacitors or small numbers of capacitors of relatively exceptional characteristics, such as electrolytic capacitors. The technique of the article is presumably applied by supplying the AC stimulus to the capacitors by clip leads or hand held probes.

It appears that the technique of the article cannot achieve successful stimulation of multiple capacitors of more typical characteristics (small capacitance) to increase their temperatures by even as little as 0.1° C. Yet testing of transient decoupling capacitors and other capacitors of relatively common or typical characteristics after they are connected into an electronic logic circuit would be of great value because new or latent weaknesses of the capacitors may be developed or revealed as a result of the processing that includes them in the integrated circuit.

SUMMARY OF THE INVENTION

It is an object of the present invention to overcome the limitations of the above described technique for thermal screening of capacitors. It is desirable to provide a method and apparatus which can develop thermographic differences between a random sample of an electronic circuit having a large number of capacitors to be screened and a normal or desirable sample of the integrated circuit. To this end it is a further object of this invention to develop a technique for more efficiently heating capacitors which are connected in a circuit, particularly in an electronic logic circuit.

Additional objects and advantages of the invention will be set forth in part in the description which follows and in part will be obvious from the description, or may be learned by practice of the invention. The objects and advantages of the invention may be realized and obtained by means of the instrumentalities and combinations particularly pointed out in the appended claims.

According to our invention, a method for testing an electronic circuit having power supply terminals and a plurality of capacitors connected substantially in parallel comprises supplying electrical power capable of exciting a selected frequency; coupling the supplied electrical power through an inductive circuit to the circuit power supply terminals to generate resonance with the plurality of capacitors at the selected frequency, whereby each of the capacitances is heated; and recording a thermal image of radiation from the heated capacitors, in which image a distinct region is associated with each capacitor.

In accordance with a feature of the preferred embodiment of the invention, the method further includes the step of capacitively dividing the voltage of the resonance with the plurality of capacitors to achieve selected combinations of voltage and current in those capacitors at the selected frequency. This technique of using capacitive voltage division allows one to employ voltages of a practical level for a voltage driver circuit, but at the same time permits not over-driving the capacitors and associated devices in the electronic circuit and allows a much finer control of the various parameters of testing.

The resonant technique of our invention is effective, even though not limited thereto, to screen a large number of capacitors connected essentially in parallel in an electronic circuit, that is, effectively to identify conditions which may eventually lead to unreliability.

Once the thermal image of a two-dimensional array of the capacitors connected in the electronic circuit has been successfully recorded, a number of techniques now exist in the art for analyzing the properties of such images with regard to known standard or reference images from circuits which have been previously tested. Some of these techniques are known as thermal subtraction analysis; and another is described in our copending patent application, Ser. No. 07/582,102, filed Sept. 14, 1990.

The principles of the invention extend to all testing or screening of capacitors, even though it is most useful for testing of large numbers of capacitors already connected in circuits.

The accompanying drawing, which are incorporated into and constitute a part of this specification, illustrate embodiments of the method and apparatus of the invention including a preferred method and apparatus and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers will be used throughout the drawings to refer to the same or like parts.

Figure 1:
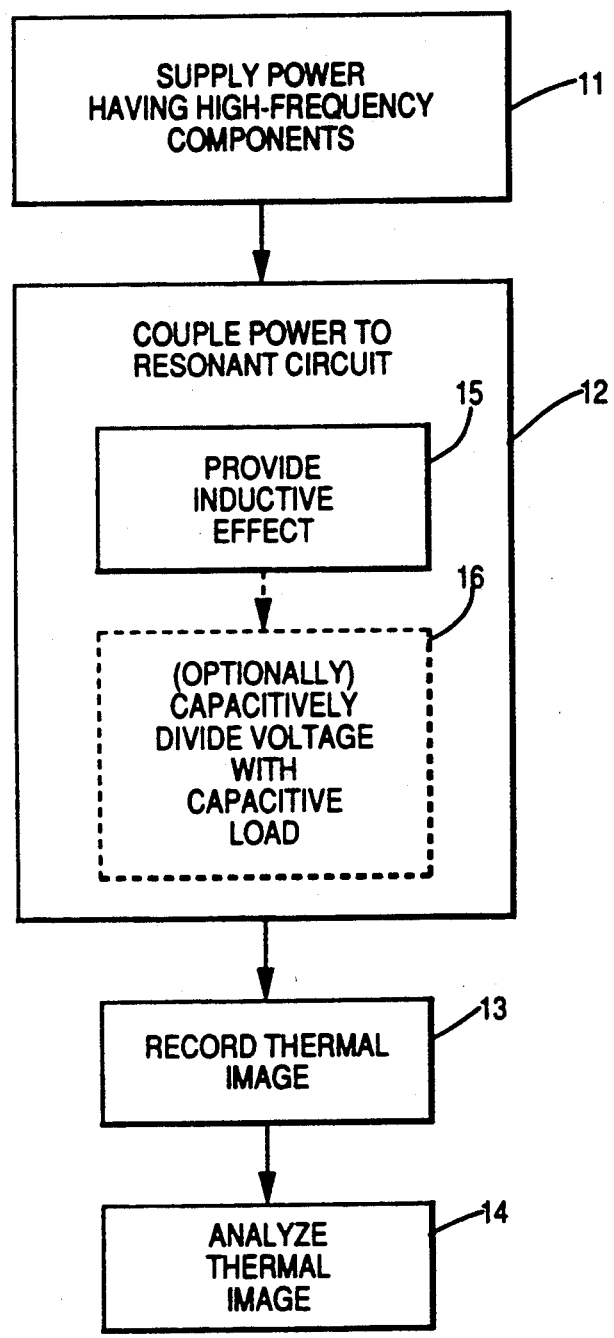
FIG. 1 is flow diagram illustrating the general steps of the method of the invention.

In the flow diagram of the steps of the method shown in FIG. 1, it may be seen that the first step 11 is to supply radio frequency power, to be applied ultimately between the power supply terminal and ground of the circuit being tested. It is to these power supply terminals that the majority of the transient decoupling capacitors in an integrated circuit will be effectively connected. For reasons which will be more fully developed hereinafter, that radio frequency power is supplied through an inductive circuit (sub-step 15) to produce a resonance effect with the capacitors. In other words, step 12 is to couple the radio frequency power to a resonant circuit including the capacitors. The next step 13 then records the thermal image which will result from, on the average, raising the temperatures of all these capacitors by at least about one tenth of a degree centigrade (0.1° C). Step 14 analyzes the thermal images by any of the known techniques in the art, provided that a quick visual inspection is insufficient. For example, step 14 may be a simple image subtraction of two comparable images, which is now well known in the thermal imaging art.

As will be developed more fully hereinafter, the power coupling step 12 preferably also includes the sub-step 16 of capacitively dividing the resonance voltage with the module of capacitors being screened.

The reasons for the use of the resonant technique may be understood from the following considerations. For most practical purposes, capacitors are generally considered to be rather ideal devices. They are seldom, if ever, considered from the thermal dissipation point of view. Nevertheless, it is possible to consider that every capacitor will have a small equivalent series resistance ("ESR") and may even be considered to have, if one could detect it, a parallel equivalent resistance called the equivalent parallel resistance. Of these two resistances, the equivalent parallel resistance can be ignored because, unless a capacitor is seriously shorted, this resistance is so high that no significant power can be dissipated thereby, certainly not at the limited test voltages which are necessary to avoid harming the bipolar transistors in typical logic circuits. On the other hand, the equivalent series resistance is measurable, and always present even though of small value. For purposes of transient decoupling, the capacitors tend to have an equivalent series resistance on the order of 0.1 ohm to about 0.001 ohm. This resistance is highly variable among units and is a function of frequency, dependent partly upon how capacitors are employed within the electronic circuit and upon the physical locations of the capacitors with respect to the electronic circuit. To heat the capacitors from their normal or ambient condition to a temperature that is elevated by as little as 0.1° C., it is necessary to produce heat in this equivalent series resistance. Our experiments showed that many of the techniques that one might think of as being obvious ways to heat the equivalent resistances of the capacitors were in fact clearly failures. For example, simply applying a high frequency square wave of a frequency, suggested by the above-referenced article, was incapable of creating a measurable response in even one capacitor. The technique of the above-referenced article fails in the context of trying to screen many relatively low-loss decoupling capacitors already connected in an electronic logic circuit.

As a simplified way of developing a basic relationship, consider a constant-current charging and discharging of the capacitors at a frequency f with a total peak-to-peak voltage swing of about 0.5V. The formula for the current is given by equation (1):

$$I = C \times \frac{\Delta V}{\Delta t} \qquad (1)$$

where $\Delta V/\Delta t$ is selected on a monotonic slope of a triangular voltage wave.

The following substitution can be made to put the relationship in terms of frequency:

$$2t = \frac{1}{f} = \tau \quad (2)$$

where $\tau$ is the period and t is the half-period of the triangular wave.

Solving equation (2) for $\tau$ yields $$t = \frac{1}{2f} \quad (3)$$

This manipulation followed by other straightforward manipulations leads to the following equations (4) and (5):

$$I = 2fCV \quad (4)$$

$$f = \frac{I}{2CV} \quad (5)$$

Equation (5) is important to an understanding of the practice of the present invention. If C is fixed by virtue of the value of the capacitors we need to test, and if a maximum value of V is set by the constraint of keeping a test voltage stimulus below the threshold of the devices resident in the integrated circuit, and if we determine a minimum current needed to create a discernible amount of heat, then the last equation yields the frequency of voltage stimulus that will be required. Of course, this only holds exactly true for a true sawtooth voltage stimulus.

From experimentation it was found that the largest acceptable test voltage stimulus that can be applied to TTL devices without "turning them on" was about 1.5 volts. For CMOS devices a value between 4 and 5 volts was found to be permissible. As an example, the case of testing 0.1 μf capacitors with an assumed ESR value of 0.05Ω was considered. It was then necessary to determine the amount of current required for such testing.

There was no published data on the thermal resistance of the type of capacitors that are likely to be tested. The thermal amount of temperature rise to be expected per mW of power dissipated by the capacitors. It is closely tied to the mass and thermal density of the capacitor itself. In order to obtain an approximate value of the thermal resistance, it was determine that a ¼ watt resistor would be a good model of the transient decoupling capacitor. In response to applying a measured amount of power to such a resistor, one determines its temperature rise by monitoring it with the thermal imager. On average, there is a 1 degree C. rise in temperature for every 7.5 mW dissipated. Actual capacitors may vary, but this gives an approximate figure to work with.

In view of equation (5) above, if one is constrained to employ a very low test voltage such as a voltage less than 0.5 volts, as typically needed for adequate safety margin for bipolar transistors in a logic circuit, the lowering of the test voltage, in turn, drives the required frequency of the excitation upward. It is quickly found from experimentation that most of the power provided by the power supply for capacitor testing by non-resonant excitation is wasted in heating the power supply, regardless of frequency. Moreover, simply raising the frequency of non-resonant excitation to limit the device voltage yields a particularly disappointing result when a linear (Class A) driver is used.

Coupling the power provided by the power supply to the electronic circuit through an inductive impedance allows more effective use of the power supply by avoiding excessive heating of the power supply. In one exemplary test arrangement, the inductive impedance was supplied by a transformer with a step-down ratio set at about 4:1 on a soft iron core, and the power supply was a so-called pulse driver, pulses being supplied from a pulse source through an amplifier to the resonant circuit including the effective inductive output impedance of the transformer and including the capacitors being tested.

Figure 2:
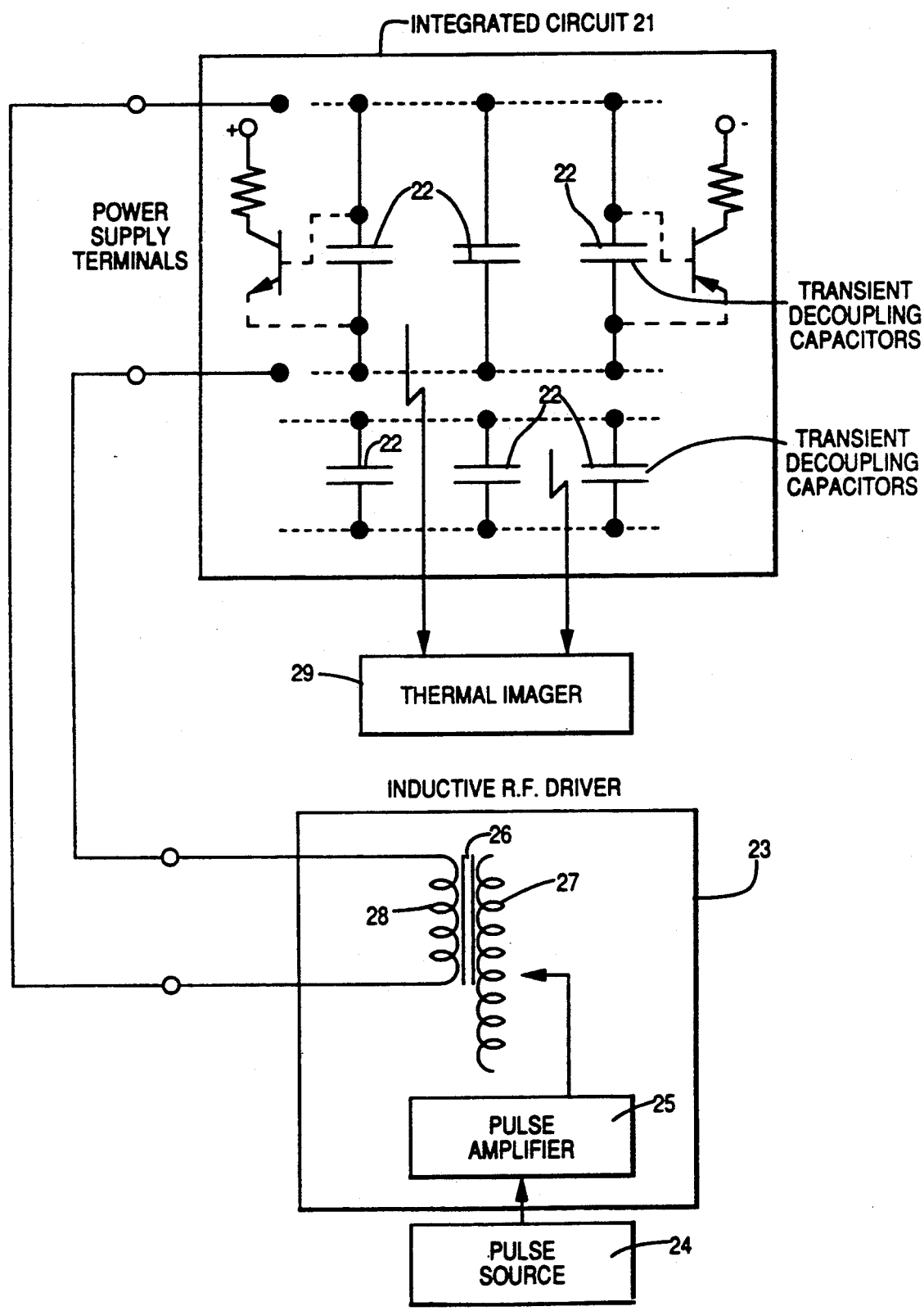
FIG. 2 is a diagram of an illustrative embodiment of an apparatus for performing the method of the invention.

Specifically, in the illustrative apparatus of FIG. 2, the voltage driving the resonant circuit provides a ringing effect much as if one were hitting a resonant structure with a hammer. The further structural implications of this technique may be seen as follows. Integrated circuit 21 includes a large number of typical ceramic decoupling capacitors 22 all of which are connected more or less effectively in parallel to the power supply terminals of the integrated circuit 21. An inductive rf driver 23 responds to a pulse from a pulse source 24 which has a rapid rise time and an output impedance which is matched to the input impedance of a pulse amplifier 25 in the inductive rf driver 23. The pulse amplifier 25 is employed effectively as a class C rf power amplifier. The effective inductance for the resonant effect is provided by a toroidal step-down transformer 26 including a primary winding 27 and a second winding 28. Step-down means that the ratio of turns of the primary 27 to the turns of the secondary 28 is greater than 1.0, for example, 4 or greater. In an actual construction of the illustrated driver 23, the transformer is wound on a toroidal core approximately 1 inch in diameter. The primary winding 27 and the secondary winding 28 are wound with relatively heavy wire of approximately 18 guage, to minimize the resistive power loss in the transformer. Secondary winding 28 is connected to the power supply terminals of integrated circuit 21 with short heavy wire.

In the operation of the illustrative embodiment of FIG. 2, it is possible to thermally stimulate integrated circuit 21, provided as a CMOS-type circuit, having approximately twenty capacitors 22, each having a capacitance of about 0.22 microfarads. The resonant circuit resonates at about 80 kHz and is able to maintain a 4 volt peak-to-peak test voltage across all of capacitors 22. The total average current drawn from the power supply 23, 24 is only 160 ma at 24 volts for a total power consumption of 3.8 watts. The pulse driver essentially acts as a switch, providing power to the resonant circuit at the appropriate time to sustain a peak sinusoidal response in the circuit. Thus, the pulse rate of the driver must be matched to the resonant frequency determined by the transformer and the capacitors under test. This can be achieved by manual adjustment or by an automatic feedback provided by monitoring the output. Maximum efficiency is obtained when the pulse rate equals the resonant frequency; however, in principle other subharmonic frequencies could be used.

Although the illustrative embodiment of FIG. 2 performed as described, it was deemed desirable to further increase the total number of capacitors that could be tested as connected in integrated circuit 21. It was further deemed desirable to increase the operating frequency so that transistor-to-transistor logic circuitry using bipolar transistors could be tested using a lower test voltage. This inverse relationship between frequency and test voltage is shown in equation (5).

Figure 3:
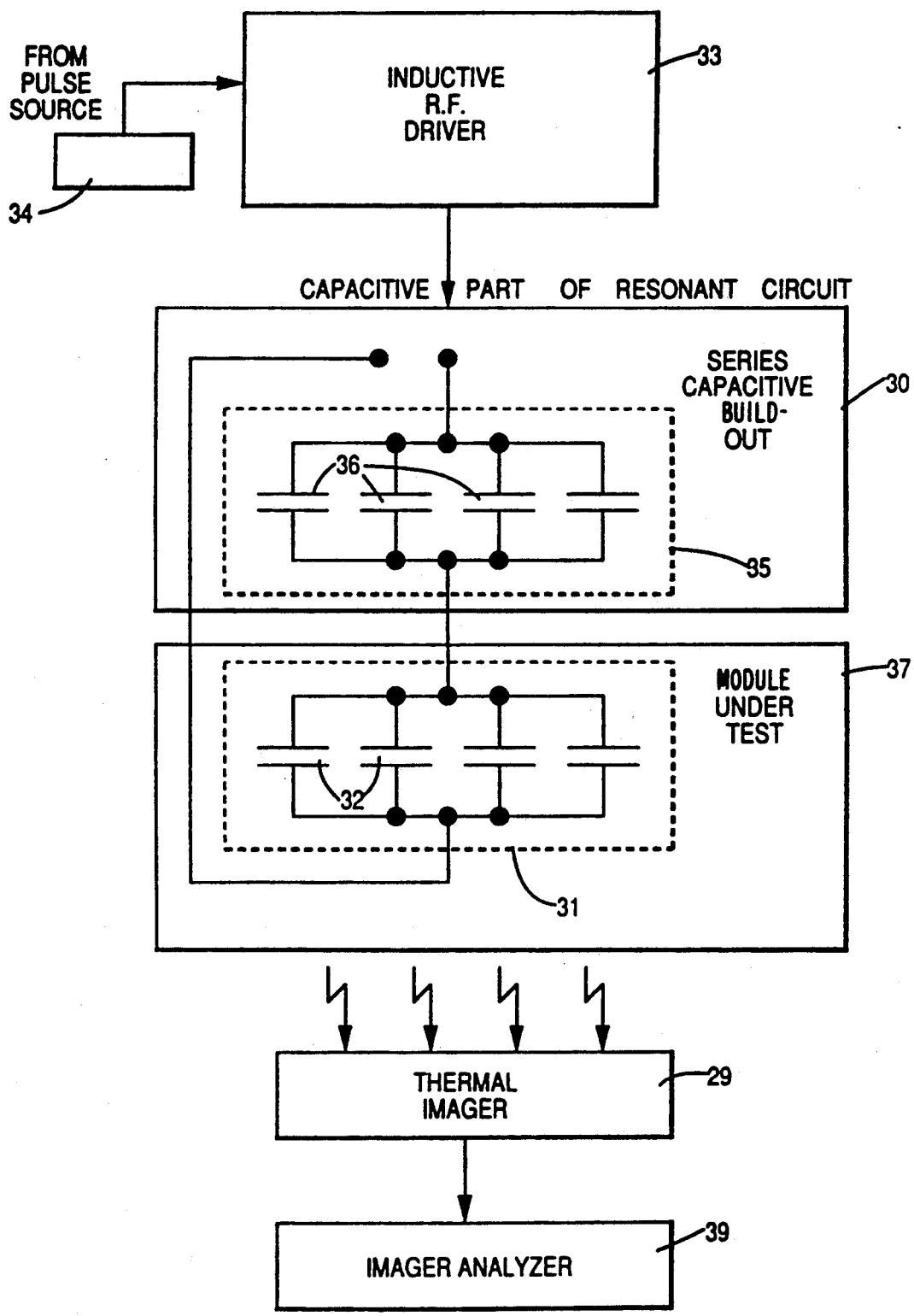
FIG. 3 is a partially block-diagrammatic and partially schematic showing of a preferred embodiment of an apparatus of the invention.

Such desirable modifications are achieved according to a preferred embodiment of the inventive technique illustrated in FIG. 3 in which a voltage-dividing capacitance 35 is used.

The embodiment of FIG. 3 differs from the embodiment of FIG. 2 in the following respects.

The capacitive portion of the resonant circuit includes two portions 30 and 37, the portion 30 comprising the voltage-dividing capacitance 35 including individual capacitors 36 connected in parallel with each other and, as a group, connected serially with the capacitive module 31 under test, which is in the separate portion 37. While module 31 may be essentially similar to the parallel-connected integrated circuit capacitors 22 of FIG. 2, it may also differ in the sense of being used in a circuit where the voltage excursions are lower.

While inductive RF driver 33 and pulse source 34 may be essentially similar to components 23 and 24 of FIG. 2, respectively, they may instead differ therefrom by being capable of higher voltages and frequencies.

Illustratively shown is an image analyzer 39 responding to a thermal imager 29. Only capacitive portion 37 of the resonant circuit is viewed and its radiation recorded by thermal imager 29.

Capacitance 35 can also be called a series capacitance-build-out since it can consist of a large number of small precise capacitors 36 connected in parallel to each other and connected in series with module 31, as shown in FIG. 3. By keeping the series capacitance 35 lower in value than the net total capacitance of the module 31 under test, the resonant frequency can be predictably controlled, resulting in a higher operating frequency than otherwise obtainable. Also, provision for variation of the capacitance 35 allows one to flexibly set the frequency at various selected frequencies It is important to note that the use of the capacitive voltage divider including the effective capacitance of module 31 and capacitance 35 results in reduction of the signal level going to module 31 and thereby keep the highest voltage to which the bipolar transistors are subjected below an acceptable level, for example 1.5 volt. The fact that a large portion of the rf driver voltage may be sustained across the capacitance 35 does not create difficulties because the capacitive voltage divider described above does not consume significant power. The capacitive voltage divider also allows the inductive rf driver 33 to operate at voltage levels at which it typically operates, while a reduced test voltage is generated. Because capacitance 35 is subjected to the total current circulating in the resonant circuit, it is preferably selected to have an equivalent series resistance lower than the capacitors being tested. The parallel connection of smaller capacitors 36 within capacitance build-out 35 is one illustrative way of keeping the effective series resistance of capacitance 35 at a desirably small value. The capacitances of the individual capacitors 36 add while the equivalent series resistances of the individual capacitors are in effect divided by the total number of capacitors 36.

Moreover, the series circuit of capacitances 31 and 35 in the capacitive voltage divider circuit within the resonant circuit enables a large degree of control over the parameters of the circuit depending on testing objectives in a particular testing context. For example, one can set the effective driver frequency substantially lower or higher than used heretofore, as need may require. The selected frequency may be in the range from 5 kHz to 300 kHz.

In both FIGS. 2 and 3 the result of the heating of the capacitors 22, 32 is registered by the thermal imager 29, which is of a type well known in the art. Once the thermal image has been recorded for a particular set of conditions, the result can be compared by any of several techniques to desired values, for instance, values found in a reference image.

Additional advantages and modifications of the method of FIG. 1 and the embodiments of FIGS. 2 and 3 will readily occur to those skilled in the art. Therefore, the invention in its broader aspects is not limited to the specific details, representative devices and illustrative examples shown and described. Accordingly, departures may be made from such details without departing from the spirit or scope of the general inventive concept as defined by the appended claims and their equivalents.

We claim:

1. A method for testing electronic circuitry having power supply terminals and a plurality of capacitors connected substantially in parallel and coupled to the supply terminals, comprising the steps of:
   supplying electrical power capable of exciting a selected frequency;
   coupling the supplied electrical power through an inductive circuit to the circuit power supply terminals to generate resonance with the plurality of capacitors at the selected frequency, so that each of the capacitors is heated; and
   recording a thermal image of radiation from the heated capacitors, in which image a distinct region is associated with each capacitor.

2. The method of claim 1, including the additional step of analyzing the thermal image.

3. The method of claim 1, including the additional step of capacitively dividing a voltage of the resonance with the plurality of capacitors to achieve selected combinations of voltage and current therein at the selected frequency.

4. The method of claim 2, including the additional step of capacitively dividing the voltage of the resonance with the plurality of capacitors to achieve selected combinations of voltage and current therein at the selected frequency.

5. A method of testing electronic circuitry including a plurality of active electronic devices, power supply terminals and a plurality of capacitors comparable in number to the number of active electronic devices and connected with respect to the power supply terminals and the active devices to protect the active devices against power supply transients, comprising the steps of:
   supplying electrical power capable of exciting a selected frequency;
   coupling the supplied electrical power through an inductive circuit to the integrated circuit power supply terminals to generate resonance with an effective capacitance including the plurality of capacitors at a selected frequency;
   capacitively dividing a voltage of the resonance with the plurality of capacitors to achieve selected combinations of voltage and current therein at the selected frequency, so that each of the capacitors is heated;

recording a thermal image of radiation from the heated capacitors, in which image a distinct region is associated with each capacitor; and analyzing the thermal image to discriminate capacitors which are anomalously heated.

6. The method of claims 5 in which the plurality of capacitors included in the logic circuit are ceramic capacitors.

7. The method of claim 6 in which the selected frequency is in the range from 5 kHz to 300 kHz and the voltage is below about 1.5 volts.

8. A system for providing a thermal stimulus to electronic circuitry having input terminals and a plurality of capacitors having respective equivalent series resistances and being connected substantially in parallel to the input terminals, to enable the making of a thermal image thereof, comprising:

means for supplying electrical power capable of exciting a selected frequency; and means, including an inductive circuit, for coupling the supplied electrical power to the circuit input terminals to enable generating resonance with the plurality of capacitors at the selected frequency and to substantially heat each of the equivalent series resistances.

9. The system of claim 8, including means for recording the thermal image.

10. The system of claim 8, including means for capacitively dividing a voltage of the resonance with the plurality of capacitors to achieve selected combinations of voltage and current therein at the selected frequency.

11. The system of claim 9, including means for capacitively dividing a voltage of the resonance with the plurality of capacitors to achieve selected combinations of voltage and current therein at the selected frequency.

12. A system for providing a thermal stimulus to a circuit including logic circuits including a plurality of active electronic devices, circuit input terminals and a plurality of capacitors comparable in number to the number of active electronic devices and conductively connected to the circuit input terminals and connected to protect the active electronic devices against power supply transients, the thermal stimulus being sufficient to enable thermal imaging of the capacitors, comprising:

system output terminals to which the circuit input terminals are connectable;

means for supplying electrical power capable of exciting a selected frequency;

means including an inductive circuit for coupling the supplied electrical power to the system output terminals, the inductive circuit have a selected inductance to generate resonance with the plurality of capacitors at the selected frequency;

means for capacitively dividing a voltage of the resonance, comprising a capacitance serially connected between the inductive circuit and the system output terminals to achieve selected combinations of voltage and current therein at the selected frequency and substantially heat each of the capacitors;

means for recording a thermal image of radiation from the heated capacitors; and means for analyzing the thermal image.

13. The system of claim 12 in which the selected frequency is in the range from 5 kHz to 300 kHz and a selected voltage is below about 1.5 volts.

* * * * *